United States Patent [19]

Reddy et al.

[11] Patent Number: 5,847,617

[45] Date of Patent: Dec. 8, 1998

[54] VARIABLE-PATH-LENGTH VOLTAGE-CONTROLLED OSCILLATOR CIRCUIT

[75] Inventors: Srinivas T. Reddy, Fremont; David Edward Jefferson, San Jose; Richard G. Cliff, Milpitas; Cameron McClintock, Mountain View, all of Calif.

[73] Assignee: Altera Corporation, San Jose, Calif.

[21] Appl. No.: 909,337

[22] Filed: Aug. 11, 1997

Related U.S. Application Data

[60] Provisional application No. 60/023,809 Aug. 12, 1996.
[51] Int. Cl.[6] .............................. H03B 5/24; H03L 7/099
[52] U.S. Cl. .............................. 331/57; 331/1 A; 331/34; 331/117 R; 331/179; 327/158; 327/159
[58] Field of Search .................................. 331/1 A, 8, 17, 331/25, 34, 57, 177 RV, 179; 327/105–107, 156–159

[56] References Cited

U.S. PATENT DOCUMENTS

| | | | |
|---|---|---|---|
| 5,349,311 | 9/1994 | Mentzer ..................................... | 331/57 |
| 5,389,898 | 2/1995 | Taketoshi et al. ..................... | 331/57 X |
| 5,418,499 | 5/1995 | Nakao ....................................... | 331/57 |
| 5,477,198 | 12/1995 | Anderson et al. .................. | 331/177 R |
| 5,559,473 | 9/1996 | Anderson et al. ......................... | 331/34 |
| 5,629,651 | 5/1997 | Mizuno .................................. | 331/57 X |

OTHER PUBLICATIONS

"Multi–Frequency Zero–Jitter Delay–Locked Loop," A. Efendovich et al., Proceedings of the IEEE 1993 Custom Integrated Circuits Conference, pp. 27.1.1–27.1.4 (1993).

"A 30–ps Jitter, 3.6–μs Locking, 3.3–Volt Digital PLL for CMOS Gate Arrays," U. Ko et al., Proceedings of the IEEE 1993 Custom Integrated Circuits Conference, pp. 23.31–23.3.4 (1993).

"Multifrequency Zero–Jitter Delay–Locked Loop," A. Efendovich et al., IEEE Journal of Solid–State Circuits, vol. 29, No. 1, pp. 67–70 (1994).

*Primary Examiner*—David Mis
*Attorney, Agent, or Firm*—Fish & Neave; Robert R. Jackson; G. Victor Treyz

[57] ABSTRACT

A variable-path-length voltage-controlled oscillator circuit is provided. The oscillator circuit has a ring oscillator formed from a series of voltage-controlled inverter stages. The path length (i.e., the number of inverter stages) in the ring is selected based on path length configuration data stored in memory. The selected path length determines the nominal or center frequency of operation of the ring oscillator. The output frequency of the oscillator circuit is voltage-tuned about this center frequency by varying the delay of each inverter stage in the ring oscillator path. Various types of voltage-controlled inverter stages may be used, including current-starved inverter stages, variable-capacitive-load inverter stages, and differential-delay inverter stages. The voltage-controlled oscillator circuit may be used in a phase-locked loop on a programmable logic device for frequency synthesis or to eliminate clock skew.

12 Claims, 7 Drawing Sheets

VARIABLE-PATH-LENGTH VOLTAGE-CONTROLLED OSCILLATOR CIRCUIT

This application claims the benefit of U.S. provisional application Ser. No. 60/023,809, filed Aug. 12, 1996.

BACKGROUND OF THE INVENTION

This invention relates to voltage controlled oscillator circuitry, and particularly to voltage-controlled oscillator circuitry that may be used in phase-locked-loop circuits on programmable logic devices.

Voltage-controlled oscillator circuits are well known. Such circuits produce an output signal having a frequency that is controlled by the magnitude of a direct current (DC) input control voltage.

Voltage-controlled oscillator circuits are used in various applications. For example, phase-locked-loop circuits use voltage-controlled oscillators.

Phase-locked-loop circuits are used for tone decoding, demodulation of amplitude or frequency modulated signals, frequency synthesis, pulse synchronization of signals from noisy sources, regeneration of clean signals, etc. Phase-locked-loop circuits may also be used to eliminate clock skew that arises when clock signals are distributed over large areas. Phase-locked-loop circuits may be used in integrated circuits for frequency synthesis applications, such as generating a 2× clock signal on an integrated circuit based on a 1× reference clock obtained from a circuit board.

Programmable logic integrated circuit devices, which are devices containing regions of logic that may be programmed to perform desired logic functions, often need phase-locked-loop circuits. Many programmable logic devices are implemented on large die, so that clock skew problems must be addressed. Moreover, different users of programmable logic devices may require different clock frequencies, so it would be desirable to be able to allow users to synthesize clock frequencies over a wide frequency range to satisfy such requirements.

However, many phase-locked-loop circuits are only able to operate accurately over a limited frequency range, due to the limited capabilities of the conventional voltage-controlled oscillators used in such phase-locked-loop circuits.

It is therefore an object of the present invention to provide improved voltage-controlled oscillator circuits.

It is a further object of the present invention to provide improved phase-locked-loop circuits using such improved voltage-controlled oscillator circuits.

SUMMARY OF THE INVENTION

These and other objects of the invention are accomplished in accordance with the principles of the present invention by providing a voltage-controlled oscillator circuit based on a variable-path-length ring oscillator. The ring oscillator contains a series of linked inverter stages. Each inverter stage has a voltage input for controlling the delay time associated with that inverter. A common voltage control line is provided to control the delay times of all of the inverters in parallel and thereby voltage-tune the oscillation frequency of the ring oscillator.

In addition, the path length of the ring oscillator (i.e., the number of active inverter stages in the ring) can be varied using a path length selection circuit. The nominal or center oscillation frequency of the voltage-controlled oscillator circuit is determined by the path length of the ring oscillator. Path length configuration data is stored in memory, which may be programmed using a programmable logic device programmer.

The inverter stages used in the oscillator circuit may be current-starved inverter stages, variable-capacitive-load inverter stages, differential-delay inverter stages, or any other suitable type of inverter stage.

If desired, the voltage-controlled oscillator circuit may be part of a phase-locked-loop circuit. Such a phase-locked loop may contain a phase detector having a reference signal input and a compare signal input. The phase detector compares the reference signal to the compare signal and provides a corresponding error signal to a low-pass filter. The low-pass filter provides a filtered version of the error signal to the inverter stages in the form of the voltage control input for the oscillator. The voltage-controlled oscillator provides an output signal at a corresponding voltage-tuned frequency (around the center frequency determined by the selected path length of the ring oscillator).

If the phase-locked loop is used in frequency synthesis applications, the phase-locked loop may be provided with a divide-by-N circuit for dividing the frequency of the output signal and applying the resulting signal to the compare signal input of the phase detector. The phase-locked loop arrangement made up of the phase detector, low-pass filter, voltage-controlled oscillator, and divide-by-N circuit produces an output signal at a frequency that is an integral multiple (N) of the frequency of the reference signal. Such arrangements may be used to generate clocks on integrated circuits at multiples of a slower clock (e.g., at multiples of a circuit board clock).

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
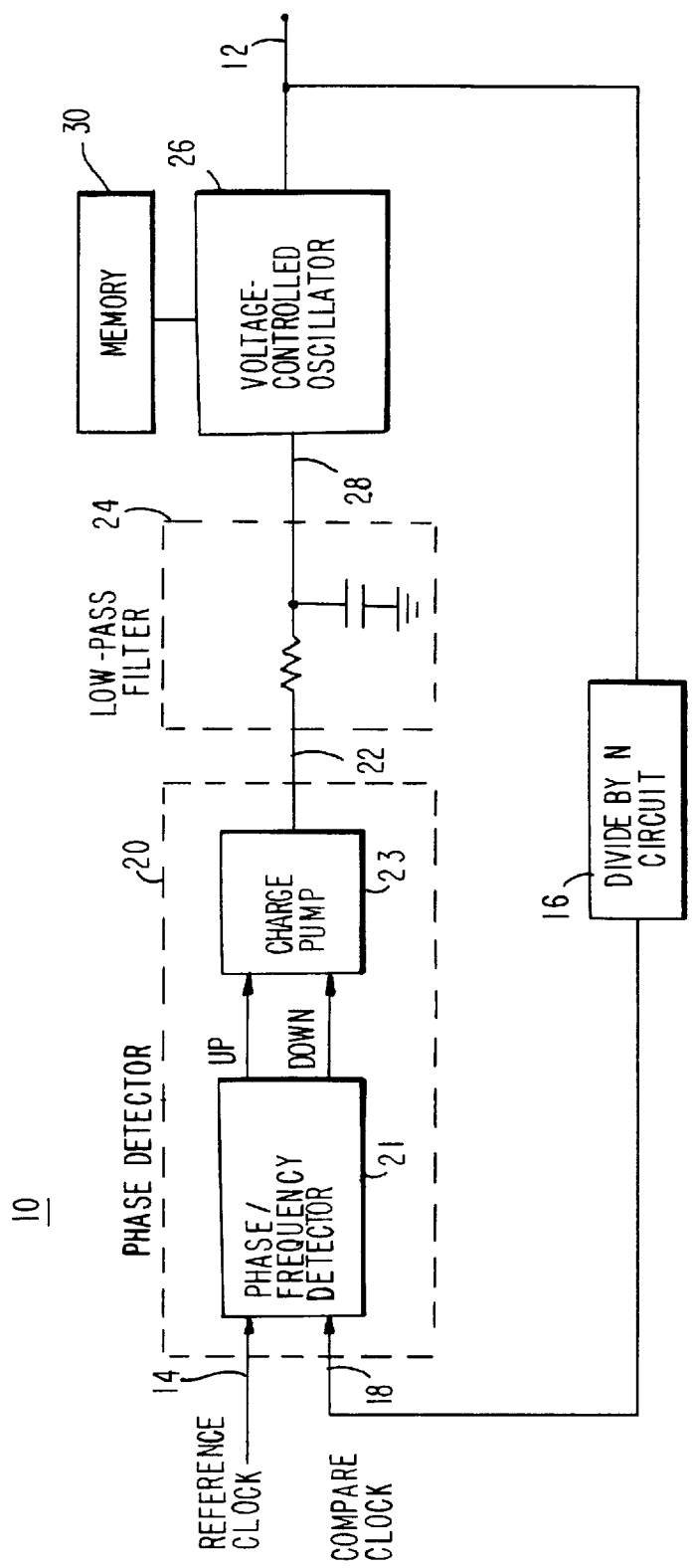
FIG. 1 is schematic circuit diagram of a phase-lock-loop circuit with voltage-controlled oscillator circuitry in accordance with the present invention.

An illustrative circuit for a phase-locked loop 10 in accordance with the present invention is shown in FIG. 1. In the arrangement shown in FIG. 1, phase-locked loop 10 generates an output signal at output 12 having a frequency that is a fixed multiple (N) of the frequency of the reference clock input signal provided at reference input 14. Divide-by-N circuit 16 divides the frequency of the output signal by N and applies a corresponding compare clock feedback signal to compare input 18.

When phase-locked loop 10 is phase locked, the compare clock signal at compare input 18 is identical in phase and frequency to the reference clock signal at reference input 14. Whenever the output signal at output 12 deviates from the given fixed multiple (N) of the reference clock, the compare clock will not be the same as the reference clock. Phase detector 20 detects the deviation of the compare clock from the reference clock and generates a corresponding error signal at output 22. Phase detector 20 may be based on a standard phase/frequency detector and charge pump arrangement as shown in FIG. 1 or may use any other suitable phase detection circuitry, such as an exclusive OR phase detector circuit arrangement. In the arrangement shown in FIG. 1, phase/frequency detector 21 generates up and down correction signals that are proportional to the deviation between compare clock signal and the reference clock signal. Charge pump 23 generates the error signal at output 22 by integrating the up and down correction signals.

The error signal generated by phase detector 20 is filtered by low pass filter 24 and is provided as an error-correcting direct current (DC) voltage control signal to voltage-controlled oscillator 26 at input 28.

The frequency of the output signal at output 12 of voltage-controlled oscillator 26 is proportional to the magnitude of the control voltage provided at input 28. Because deviations in the output frequency from the given multiple of the reference clock result in error-correcting feedback signals that are applied to input 28, the frequency of the output signal at output 12 becomes locked to the given multiple of the reference clock.

Voltage-controlled oscillator 26 is based on a ring oscillator circuit. The center output frequency of voltage-controlled oscillator 26 is determined by the number of inverter stages in the ring. Each inverter stage has an associated tunable delay time. Tuning the delay times of the inverter stages adjusts the output frequency of voltage-controlled oscillator 26 in a range about the center frequency.

The center frequency of voltage-controlled oscillator 26 can be programmably adjusted by changing the number of inverter stages in the ring path. When the ring oscillator in voltage-controlled oscillator 26 is programmed to have a long path length (i.e., when the ring contains many inverter stages), the center frequency of voltage-controlled oscillator 26 is relatively low. When the ring oscillator has a short path length (i.e., when the ring contains few inverter stages), the center frequency of voltage-controlled oscillator 26 is relatively high.

Programming data that sets the path length of the ring (i.e., path length configuration data) is stored in memory 30. Memory 30 may be any suitable programmable memory device, such as a static random-access memory, dynamic random-access memory, fuse or antifuse memory, read-only memory, erasable programmable read-only memory, electrically erasable programmable read-only memory, etc. Standard programming equipment such as a programmer of the type used to program programmable logic devices may be used to configure memory 30.

After the center frequency of voltage-controlled oscillator 26 is adjusted, voltage-controlled oscillator 26 may be tuned by varying the control voltage at input 28. Adjusting the center frequency of voltage-controlled oscillator 26 by programming memory 30 improves the overall tuning range of voltage-controlled oscillator 26 without sacrificing tuning accuracy.

Figure 2:
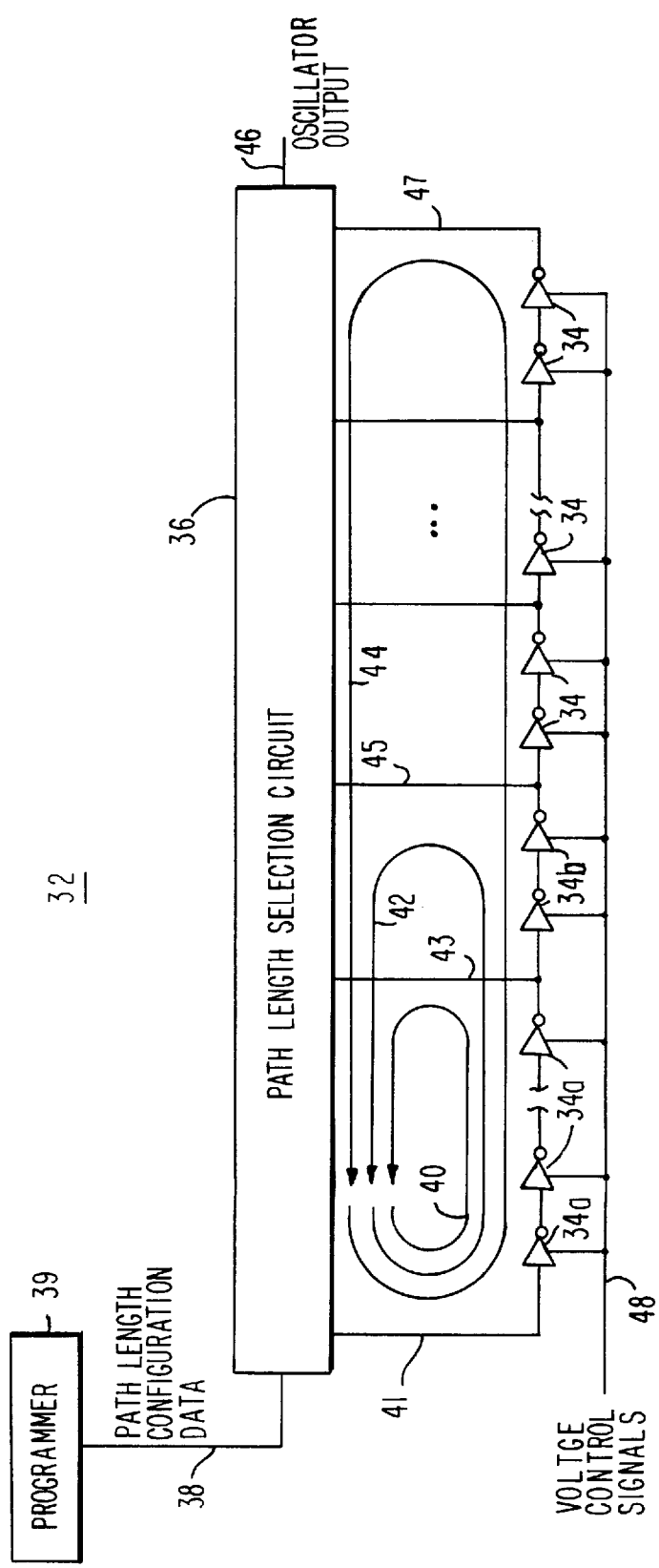
FIG. 2 is a circuit diagram of an illustrative variable-path-length voltage-controlled oscillator circuit in accordance with the present invention.

The variable-path-length oscillator arrangement of the present invention is shown in FIG. 2. Variable-path-length oscillator circuit 32 contains a ring oscillator circuit made up of inverter stages 34. Inverter stages 34 are connected in rings of various lengths by path length selection circuitry 36 in response to path length configuration data provided at input 38. The path length configuration data may be provided to input 38 by programmer 39, which may be, for example, a programmable logic device programmer. The length of the selected path (i.e., the number of inverter stages in the path) determines the center frequency of oscillator circuit 32. Paths with many inverter stages 34 exhibit relatively low oscillation frequencies. Paths with few inverter stages 34 exhibit relatively high oscillation frequencies.

The shortest possible path in circuit 32 is path 40, which is formed using path output 41 and path input 43 and which preferably contains inverters 34a (only three of which are shown in FIG. 2). The next shortest path available in circuit 32 is path 42, which is formed using path output 41 and path input 45 and which contains two additional inverter stages 34b. The smallest number of inverter stages that can be added to a path is two, because each path must contain an odd number of inverter stages. The largest path available in circuit 32 is path 44, which is formed using path output 41 and path input 47. The output of circuit 32 is provided at oscillator output 46 (which corresponds to oscillator output 12 in FIG. 1).

In addition to controlling the operating frequency of oscillator 32 with path length selection circuit 36, the operating frequency of oscillator circuit 32 is controlled by adjusting the delay times of inverter stages 34 by applying appropriate control voltages via input 48.

Figure 3:
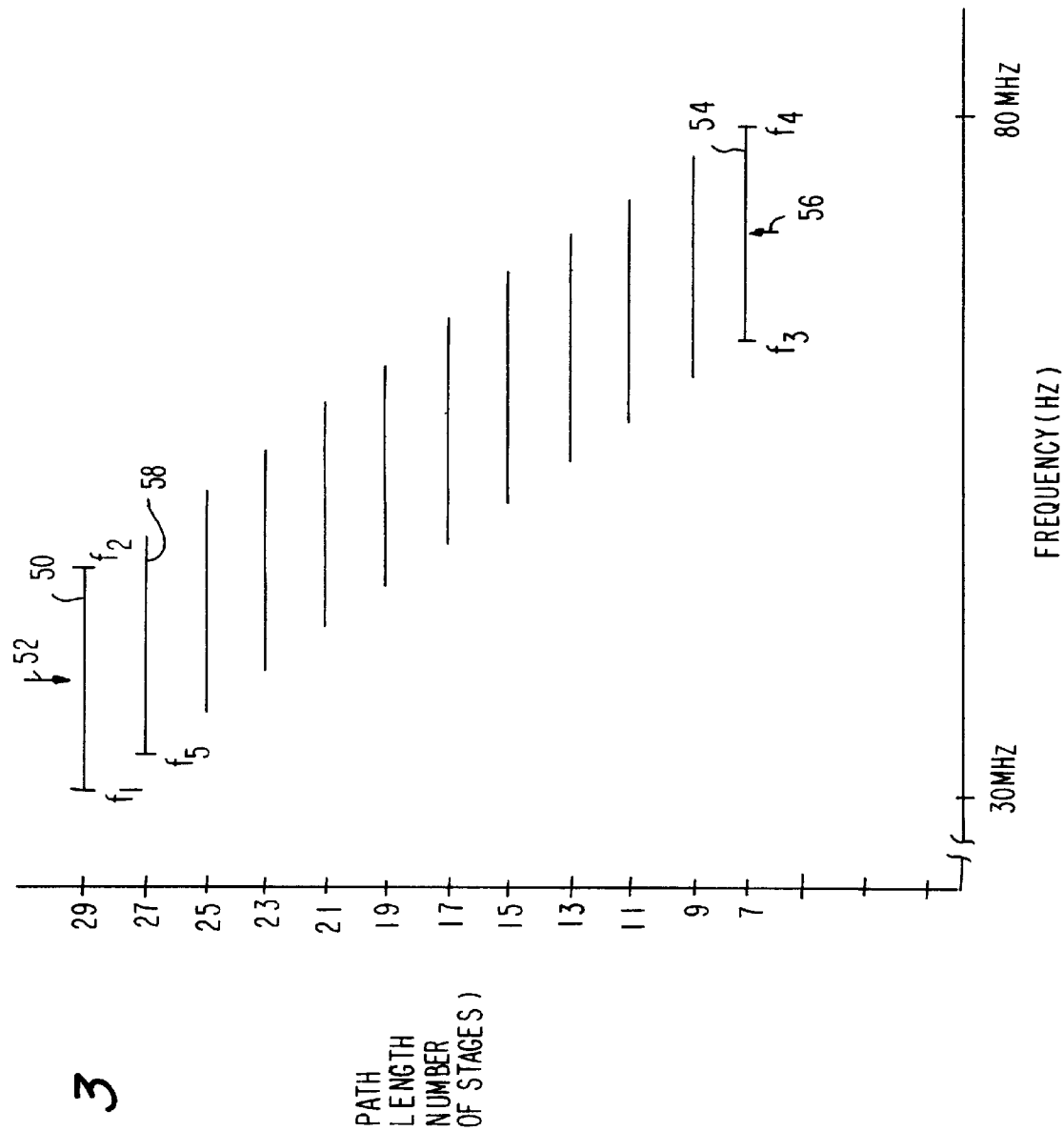
FIG. 3 is a graph showing the voltage-tuned operating frequency ranges for the illustrative voltage-controlled oscillator circuit of FIG. 2 for various path lengths.

In one illustrative embodiment of circuit 32, there are at least seven inverter stages 34 in path 40, there are 29 inverter stages 34 in path 44, and there are 12 possible path lengths available (7, 9, 11, 13, 15, 17, 19, 21, 23, 25, 27, and 29). The frequency ranges of the output signals that can be produced using this embodiment of circuit 32 are shown in FIG. 3.

Output signals in frequency range 50 are generated when path length selection circuit 36 has selected path 44. Tuning between frequencies f1 and f2 about center frequency 52 is accomplished by varying the voltage control signals applied to input 48 to adjust the delay times of inverters 34 in path 44. Output signals in frequency range 54 are generated when path length selection circuit 36 has selected path 40. Tuning between frequencies f3 and f4 about center frequency 56 is accomplished by varying the voltage control signals applied to input 48 to adjust the delay times of inverters 34 in path 40. Output signals in the frequency ranges between frequency range 50 and frequency range 56 have center frequencies that fall between the center frequencies of ranges 50 and 56. The tuning range of each frequency range is approximately the same.

In order to guarantee overlap in the frequency ranges of oscillator circuit 32, the frequency ranges of the present invention are preferably such that the highest frequency of a given range at least more than 20% higher than the lowest frequency of the next frequency range. For example, frequency f2 of range 50 is preferably more than 20% greater than frequency f5 of range 58. This relationship holds under all likely operating and fabrication conditions for circuit 32.

Inverter stages of any suitable type may be used in oscillator circuit 32, such as current-starved inverter stages, variable-capacitive-load inverter stages, differential-delay inverter stages, etc.

Figure 4:
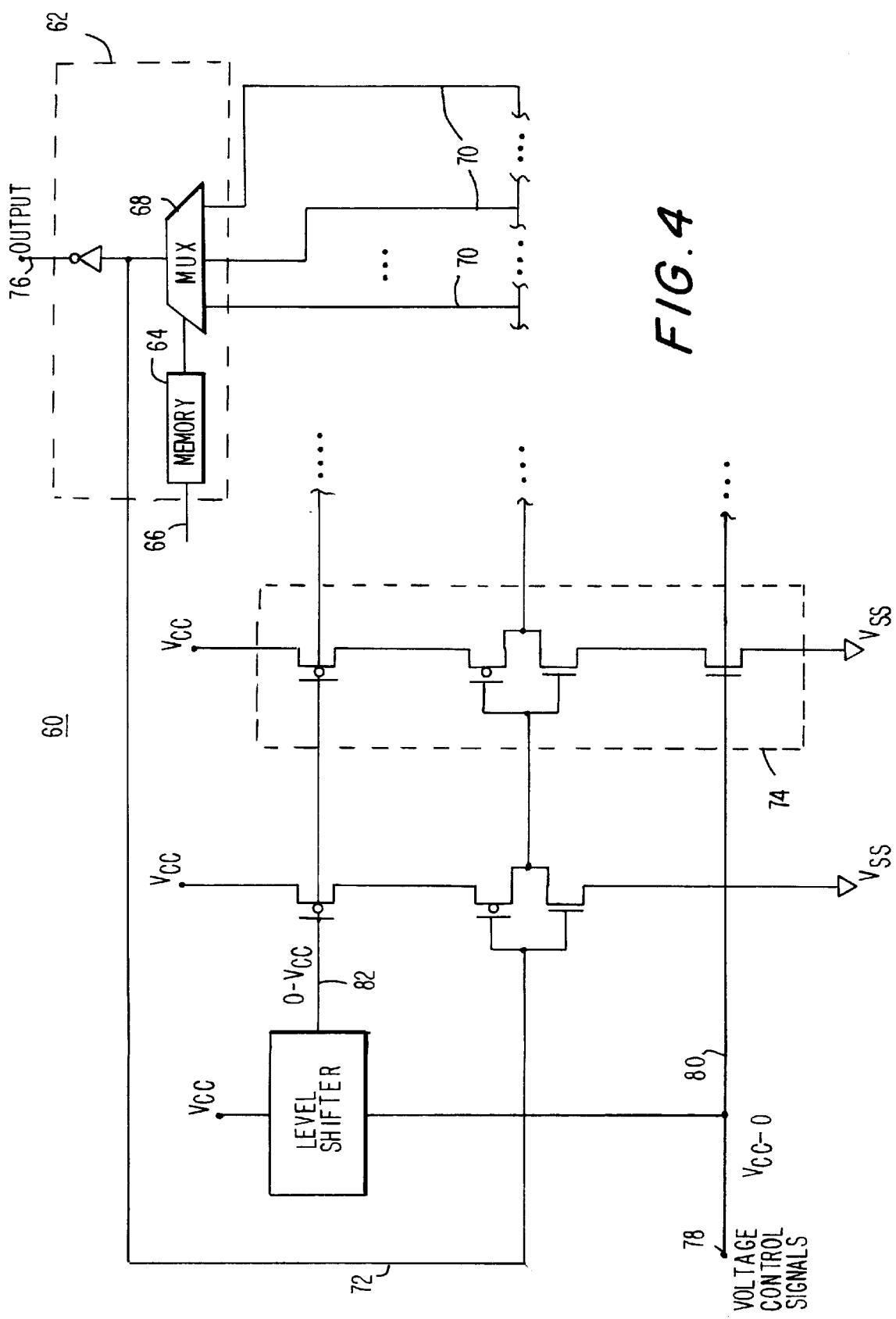
FIG. 4 is a circuit diagram of a voltage-controlled oscillator in accordance with the present invention that uses current-starved inverter stages.

An illustrative oscillator circuit 60 based on current-starved inverter stages is shown in FIG. 4. In circuit 60, path length selection circuit 62 contains memory 64 for storing path length configuration data received at input 66. Memory 64 applies the path length configuration data to multiplexer 68, which connects a selected input line 70 to return line 72. The number of current-starved inverter stages 74 between return line 72 and line 70 determines the path length and therefore the nominal or enter frequency of circuit 60 at output 76. To voltage tune the frequency of the signal at output 76, a control voltage signal is applied to input 78. As is well known, the delay time of current-starved inverter stages such as stages 74 is determined by the voltages on control line 80 and voltage-shifted control line 82. When used in a phase-locked-loop circuit such as shown in FIG. 1, memory 64 in FIG. 4 corresponds to memory 30 in FIG. 1 and input 78 and output 76 in FIG. 4 correspond to input 28 and output 12 in FIG. 1.

Figure 5:
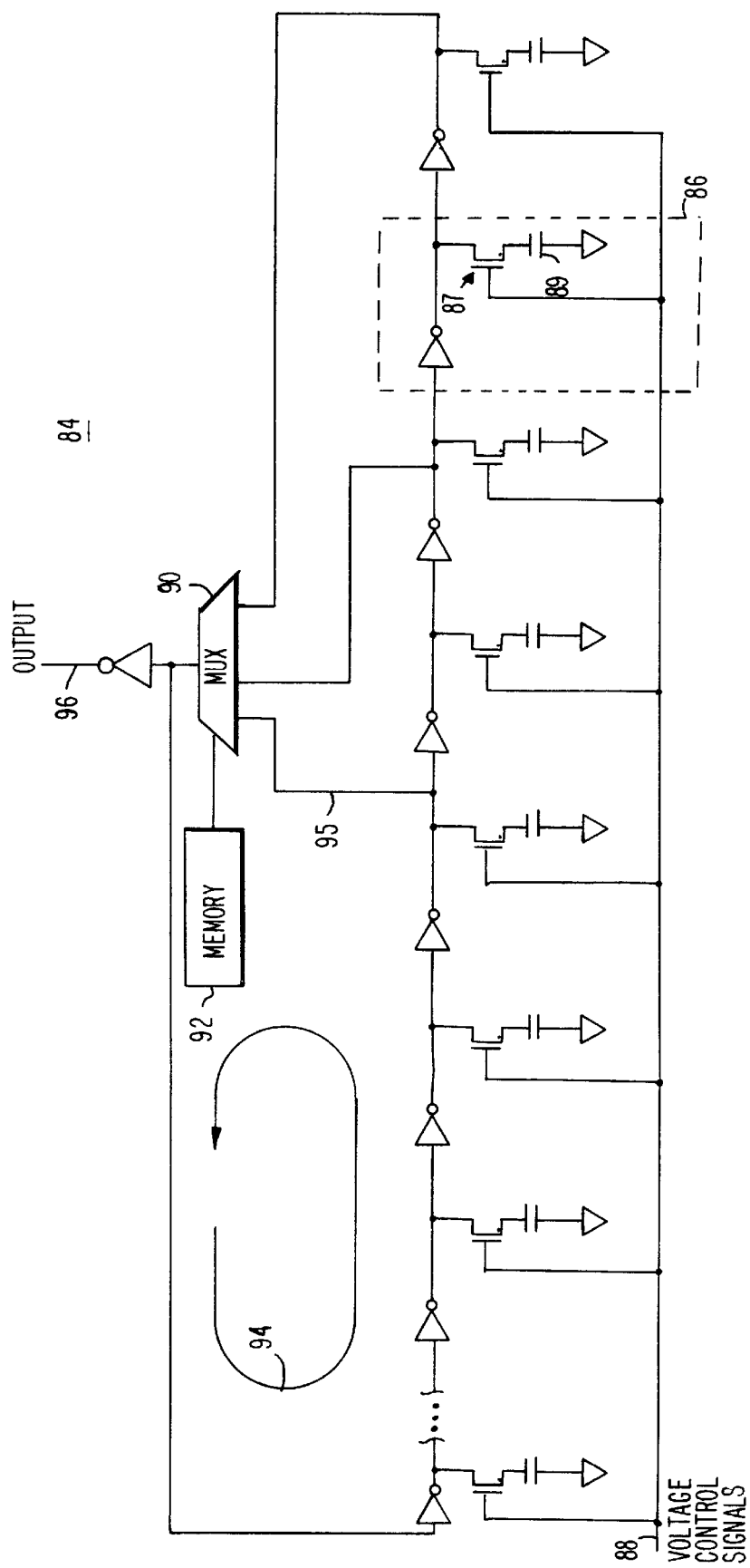
FIG. 5 is a circuit diagram of a voltage-controlled oscillator in accordance with the present invention that uses variable-capacitive-load inverter stages.

An illustrative oscillator circuit 84 based on variable-capacitive-load inverter stages 86 is shown in FIG. 5. The capacitive loading of each inverter stage 86 is controlled by varying the gate voltage on the associated transistor 87 coupled to capacitor 89. Varying the capacitive loading of each inverter stage 86 varies the delay for that inverter stage 86. The delay of all stages 86 can be controlled in parallel by the varying the value of the voltage control signals applied to input 88.

Inverter stages 86 form a ring oscillator with a path length that is selected by multiplexer 90 based on path length configuration data supplied to multiplexer 90 from memory 92. The shortest possible path with the arrangement of FIG. 5 is path 94, which is formed by selecting the input of multiplexer 90 connected to input line 95. Each possible path has an odd number of inverter stages 86. Although only three possible paths are illustrated in FIG. 5, circuit 84 may have any suitable number of possible paths, each of which uses an associated input of multiplexer 90. The frequency of the signal generated at output 96 is determined by the path length of the selected ring oscillator path that is formed. When used in a phase-locked-loop circuit such as shown in FIG. 1, memory 92 in FIG. 5 corresponds to memory 30 in FIG. 1 and input 88 and output 96 in FIG. 5 correspond to input 28 and output 12 in FIG. 1.

In one illustrative embodiment of circuit 84, there are at least seven inverter stages 86 in the shortest path, 29 stages in the largest path, and 12 possible path lengths available (7, 9, 11, 13, 15, 17, 19, 21, 23, 25, 27, and 29). The frequency ranges of the output signals that can be produced using this embodiment of circuit 84 are shown in FIG. 3. In each frequency range illustrated in FIG. 3, the center frequency is determined by the path length of the ring oscillator. Voltage tuning using voltage control signals applied to input 88 allows circuit 84 to be tuned from the lowest to the highest frequency shown for each frequency range.

Figure 6:
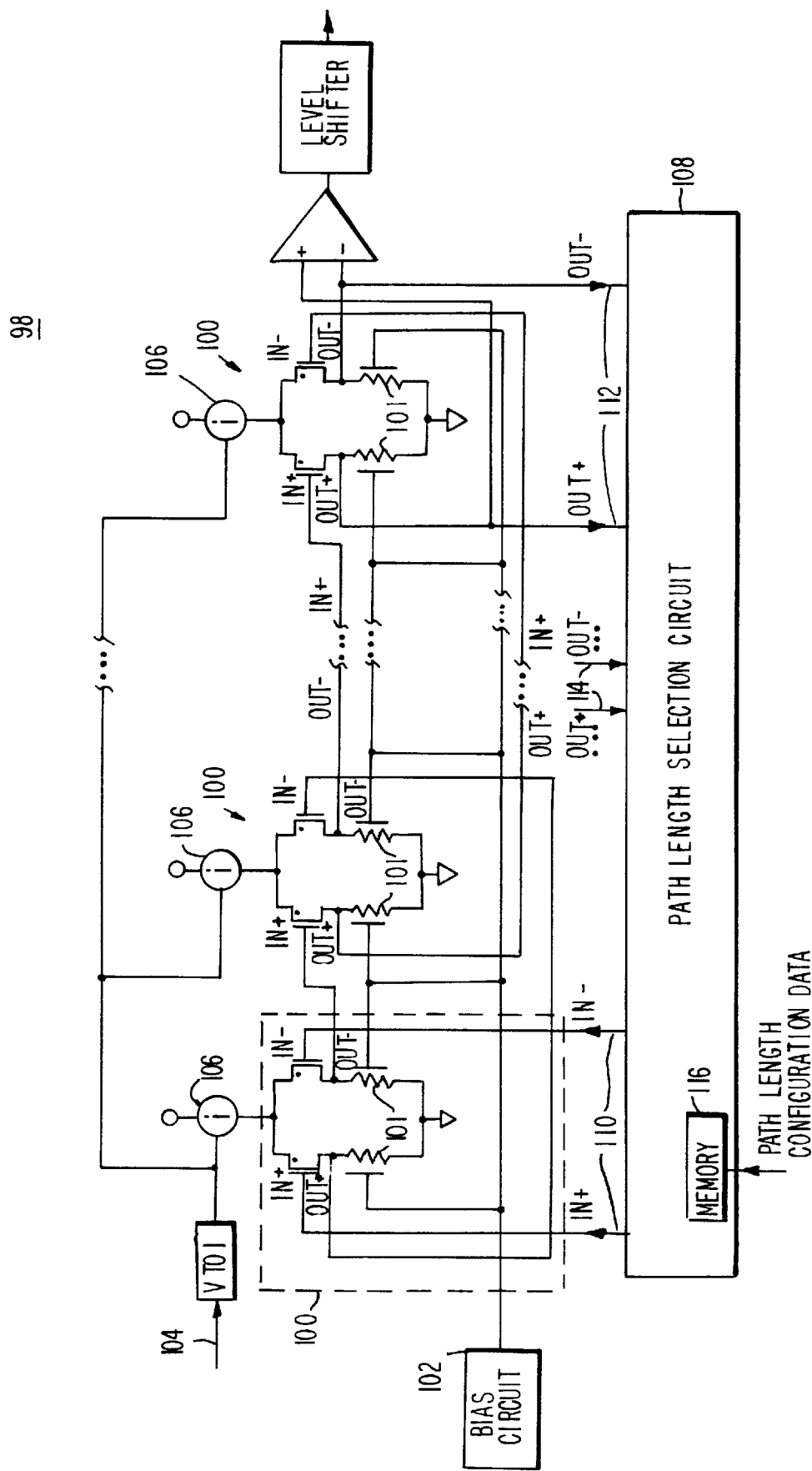
FIG. 6 is a circuit diagram of a voltage-controlled oscillator in accordance with the present invention that uses differential-delay inverter stages.

An illustrative oscillator circuit 98 based on differential-delay inverter stages 100 is shown in FIG. 6. Circuit 98 is biased by applying the output of bias circuit 102 to the gates of voltage-controlled resistors 101 in each stage 100. Voltage control input signals at input 104 control current sources 106, thereby adjusting the delay time of each differential-delay inverter stage 100.

Stages 100 are linked by connecting the out+ and out− outputs of each stage 100 to the respective in− and in+ inputs of a successive inverter stage 100 to form a ring oscillator. A ring oscillator of a desired path length can be formed using path length selection circuit 108 to connect path length selection circuit output line pair 110 to a selected pair of path length selection circuit input lines such as input line pair 112 or input line pair 114.

Memory 116 may be used to store path length configuration data for path length selection circuit 108. Path length configuration data may be provided to memory 116 using any suitable approach, such as by using a programmable logic device programmer (such as shown in FIG. 2) to program the path length configuration data into memory 116. Because circuit 98 uses differential stages, circuit 98 exhibits excellent noise immunity and high gain, is capable of high power supply rejection, and has low temperature sensitivity. However, circuit 98 is somewhat more complicated than circuit 60 (FIG. 4) and circuit 84 (FIG. 5).

In one illustrative embodiment of circuit 98, there are approximately three inverter stages in the shortest path, nine stages in the largest path, and four possible path lengths available (3, 5, 7, and 9). The frequency range coverage of this embodiment of circuit 98 is preferably comparable to the frequency range coverage of circuits 60 and 84, which is possible because differential-delay inverter stages 100 have fairly large voltage-controlled tuning ranges.

Phase-locked loop 10 may be used to eliminate clock skew, for frequency synthesis, or any other suitable application. One suitable application of phase-locked loop 10 is for on-chip frequency synthesis to generate a stepped-up clock that is synchronized with a somewhat slower circuit board or system clock.

Figure 7:
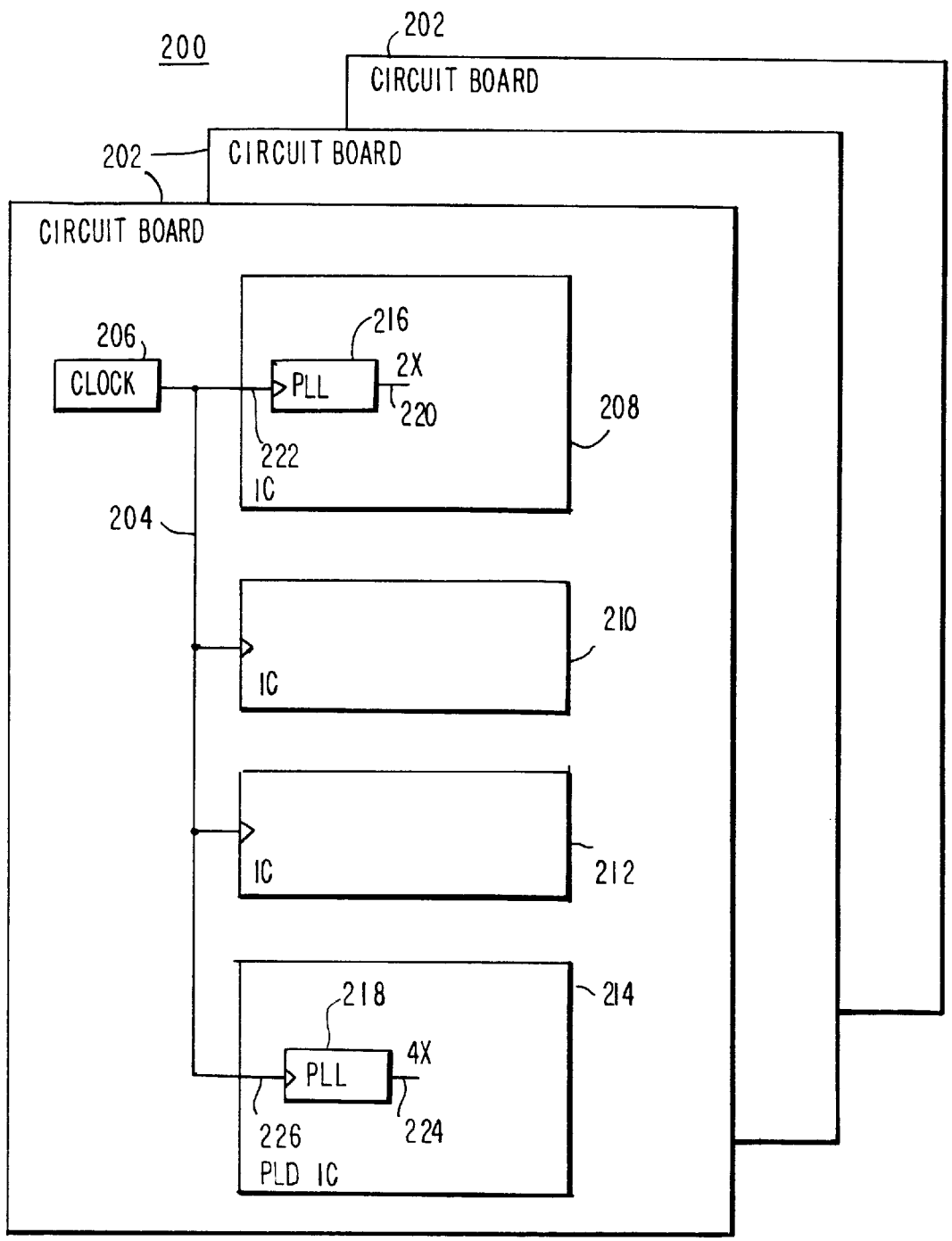
FIG. 7 is a schematic circuit diagram showing the use of phase-locked-loop circuits of the present invention to step up a circuit board clock.

An arrangement of this type is illustrated in FIG. 7.

As shown in FIG. 7, system 200 has multiple circuit boards 202, which may be connected by a common bus (not shown). Circuit board clock signals may be distributed through system 200 by clock distribution lines 204. In the illustrative example shown in FIG. 7, circuit board clock signals generated by clock circuit 206 are distributed to integrated circuits 208, 210, 212, and 214. Some integrated circuits, such as integrated circuits 210 and 212, use the clock signal directly, without altering the frequency of the clock. Other integrated circuits, such as integrated circuit 208 and programmable logic device integrated circuit 214, use phase-locked-loop circuits 216 and 218 having a design such as shown in FIG. 1. In phase-locked-loop circuit 216, divide-by-N circuit 16 (FIG. 1) has a value of N equal to two. As a result, the frequency of the stepped-up clock generated at output 220 is 2× the frequency of the circuit board clock provided at input 222. In phase-locked-loop circuit 218, divide-by-N circuit 16 (FIG. 1) has a value of N equal to four. The frequency of the stepped-up clock generated at output 224 is therefore 4× the frequency of the circuit board clock provided at input 226. The stepped-up clocks at outputs 220 and 224 allow integrated circuits 208 and 214 to operate with a faster clock than circuit board clock 206, so that logic operations on integrated circuits 208 and 214 can be performed more rapidly than would otherwise be possible.

The ability to frequency synthesize stepped-up clocks on a chip-by-chip basis allows the circuits that operate fastest in a system to benefit from fast clocks without forcing slower components to operate with clocks faster than they can support.

The foregoing is merely illustrative of the principles of this invention and various modifications can be made by those skilled in the art without departing from the scope and spirit of the invention.

What is claimed is:

1. A programmable logic device that is proarammed using a programmable logic device programmer comprising:

a series of linked inverter stages having controllable delay times;

a path length selection circuit that forms a ring oscillator having a selected path length from the inverter stages in response to path length configuration data;

an oscillator output connected to the ring oscillator that provides an output signal with a frequency determined by the selected path length and by the delay times of the inverter stages; and programmable memory that is configured to store the path length configuration data and that is programmed with the path length configuration data using the programmable logic device programmer.

2. The programmable logic device defined in claim 1 wherein the path length selection circuit comprises a multiplexer having a path output connected to one end of the series of linked inverter stages and having a plurality of path inputs each connected to a point in the series of linked inverter stages between a different pair of adjacent inverter stages, the selected path length being formed by connecting a selected one of the path inputs to the path output in response to the path length configuration data.

3. The programmable logic device defined in claim 1 wherein the inverter stages are controlled by a common voltage-control signal received in parallel by all of the inverter stages, the oscillator circuit further comprising:

a phase detector that receives a reference signal and a compare signal and generates a corresponding error signal; and a low-pass filter that filters the error signal and provides the filtered error signal to the inverter stages as the common voltage-control signal.

4. The programmable logic device defined in claim 3 further comprising a divide-by-N circuit for dividing the frequency of the signal at the oscillator output by N and passing the resulting signal to the phase detector as the compare signal.

5. The programmable logic device defined in claim 1 wherein the path length selection circuit comprises a multiplexer having a path output connected to one end of the series of linked inverter stages and having a plurality of path inputs each connected to a point in the series of linked inverter stages between a different pair of adjacent inverter stages, the selected path length being formed by connecting a selected one of the path inputs to the path output.

6. The programmable logic device defined in claim 1 wherein the inverter stages are current-starved inverter stages.

7. The programmable logic device defined in claim 1 wherein the inverter stages are variable-capacitive-load inverter stages.

8. The programmable logic device defined in claim 1 wherein the inverter stages are differential-delay inverter stages.

9. The programmable logic device defined in claim 1 further comprising a phase detector that provides an error signal to the inverter stages in the form of a voltage control signal that controls the delays of the inverter stages.

10. The programmable logic device defined in claim 1 wherein the programmable memory is a random-access memory.

11. A programmable logic device that is programmed using a programmable logic device programmer comprising:

a series of linked inverter stages each having an input for a control voltage and each having a delay time controlled by the magnitude of the control voltage;

a path length selection circuit connected to the linked inverter stages to form a ring oscillator having a selected one of various path lengths in response to path length configuration data;

a ring oscillator output that provides an output signal at a frequency determined by the selected path length and the magnitude of the control voltage; and programmable memory that is configured to store the path length configuration data and that is programmed with the path length configuration data using the programmable logic device programmer.

12. The programmable logic device defined in claim 11 further comprising:

a phase detector for generating an error signal based on the comparison of a reference signal and a compare signal;

a filter for filtering the error signal and providing the filtered error signal to the inverter stages as the control voltage; and a divide-by-N circuit for dividing the frequency of the ring oscillator output signal and passing the resulting signal to the phase detector as the compare signal.

* * * * *